United States Patent [19]
Ovens et al.

[11] Patent Number: 5,517,107
[45] Date of Patent: May 14, 1996

[54] ON-CHIP VARIANCE DETECTION FOR INTEGRATED CIRCUIT DEVICES

[75] Inventors: Kevin M. Ovens, Garland; Alan S. Bass, Plano; Jay A. Maxey, Garland, all of Tex.

[73] Assignee: Texas Instruments Incorporated, Dallas, Tex.

[21] Appl. No.: 226,246

[22] Filed: Apr. 11, 1994

Related U.S. Application Data

[62] Division of Ser. No. 64,783, May 11, 1993, abandoned, which is a continuation of Ser. No. 636,819, Jan. 2, 1991, abandoned.

[51] Int. Cl.⁶ .................................................. G01R 27/22
[52] U.S. Cl. .................... 324/158.1; 324/716; 324/719
[58] Field of Search ................................ 324/716, 719, 324/765, 766, 158.1, 73.1, 71.5; 437/8; 257/48, 40

[56] References Cited

U.S. PATENT DOCUMENTS

| | | | |
|---|---|---|---|
| 3,808,527 | 4/1974 | Thomas | 437/8 |
| 4,144,493 | 3/1979 | Lee et al. | 324/158 R |
| 4,347,479 | 8/1982 | Cullet | 324/716 |
| 4,516,071 | 5/1985 | Buchler | 324/716 |
| 4,542,340 | 9/1985 | Chakravarti et al. | 324/158 T |
| 4,672,314 | 6/1987 | Kokkas | 324/719 |
| 4,835,466 | 5/1989 | Maly et al. | 24/158 R |
| 4,855,253 | 8/1989 | Weber | 437/8 |
| 4,906,921 | 3/1990 | Fuge | 324/158 D |
| 4,918,377 | 4/1990 | Buehler et al. | 324/158 R |
| 4,933,635 | 6/1990 | Deutsch et al. | 324/158 D |
| 4,956,611 | 9/1990 | Maltiel | 437/8 |
| 4,967,146 | 10/1990 | Morgan et al. | 324/158 D |
| 4,994,736 | 2/1991 | Davis et al. | 324/158 T |
| 5,051,690 | 9/1991 | Maly et al. | 324/158 R |
| 5,082,792 | 1/1992 | Pasch et al. | 437/7 |
| 5,247,262 | 9/1993 | Cresswell et al. | 324/716 |

OTHER PUBLICATIONS

IBM Technical Disclosure Bulletin, vol. 17, No. 10, Mar. 1975, New York, pp. 2905–2907, J. H. Lee and A. V. S. Satya "Three–Device FET Diagnostic Testing Scheme".

*Primary Examiner*—Vinh P. Nguyen
*Attorney, Agent, or Firm*—Alan K. Stewart; Richard L. Donaldson; William E. Hiller

[57] ABSTRACT

A process variance detection technique for detecting fabrication processing variances in integrated circuit components, such as resistors or MOSFETs, is based on the decreased sensitivity to processing variations exhibited by components that are up-sized relative to similar components with nominal dimensions. Detection circuitry includes detection components with both nominal and up-sized dimensions, and variance detection involves detecting the differences in operational response of the nominal and up-sized detection components. For bipolar logic, resistors are fabricated with up-sized widths, while for MOS logic, MOSFETs are fabricated with up-sized gate lengths.

14 Claims, 1 Drawing Sheet

ON-CHIP VARIANCE DETECTION FOR INTEGRATED CIRCUIT DEVICES

This application is a Divisional of application Ser. No. 08/064,783, filed May 11, 1993, which is a Continuation of application Ser. No. 07/636,819, filed on Jan. 2, 1991, both abandoned now.

TECHNICAL FIELD OF THE INVENTION

The invention relates generally to integrated circuit fabrication, and more particularly relates to on-chip variance detection circuits and methods for detecting variances in integrated circuit components. In even greater particularity, the invention relates to an on-chip variance detection technique for detecting fabrication processing variances, such as for the purpose of implementing voltage and/or current compensation.

BACKGROUND OF THE INVENTION

Process variations in integrated circuit fabrication cause variances in component dimensions, such as resistor width or transistor gate length, that affect circuit performance.

The specific problem to which the invention is applicable is the on-chip detection of these fabrication processing variances so as to enable integrated circuit designers to implement compensation schemes and thereby reduce the effect of variance on circuit performance Most integrated circuits are designed using matched components to minimize the effects of process variability. Nevertheless, using conventional photolithographic techniques, significant process variance cannot be avoided. For example, process variances occur in photoresist procedures (including exposure time and developing), implant procedures and etching procedures, resulting in variations in the dimensions of the various deposited, implanted or etched regions that form the integrated circuits.

Moreover, these dimensional variances are not random, but rather occur in process steps that affect numerous components in the same way. That is, weak processing conditions will result in resistor widths that are generally less than nominal and gate lengths are generally greater than nominal, while strong processing conditions have just the opposite general effect. As a consequence, overall integrated circuit performance is affected.

Some processing variances are more critical to integrated circuit performance than others. For example, the most significant impact on performance in the case of bipolar processing is attributable to variations in resistor widths, and in the case of MOSFET processing is attributable to variations in gate lengths.

Specifically, bipolar delay and power are functions of resistor values, which are a function of resistor width. Similarly, MOSFET delay, edge rate, and power are a function of gate length. Using conventional photolithographic fabrication processes, for typical component sizes with nominal resistor widths of 3 microns or nominal gate lengths of 0.8 microns, resistor widths and gate lengths will generally exhibit variances in the range of 15–20% based on variations in resistor widths in the range of 0.4–0.5 microns and variations in gate lengths in the range of 0.15 microns.

The most common technique for reducing process variances is to increase nominal component size, so that a given dimensional variation is less of a percentage of nominal, and therefore, has less impact on component performance. Stated another way, a common result of process variances is that component sizes cannot be reduced below a minimum that is set by performance considerations attributable to processing variances rather than fabrication processing technology. This design constraint is disadvantageous in that it increases the chip area that must be allocated to those components that are significantly affected by process variances, and may even adversely affect performance of the integrated circuit.

The impact of process variances can be somewhat alleviated by focusing on those components and associated circuitry in which variations from design specifications are most detrimental. That is, component size can be increased for those circuits, such as regulators, oscillators, and other high speed logic, where performance output is particularly critical. For example, in the case of an integrated circuit design in which nominal resistor widths for bipolar circuitry are 3 microns, selected circuits can be fabricated using 30 micron resistor widths to reduce the effects of process variations on integrated circuit performance.

Such an approach is disadvantageous in that, for many integrated circuit designs, a significant portion of the circuitry will have to be up-sized. Further, such an approach does not solve the problem of process variance constraints that restrict further technologically feasible down-sizing of integrated circuit components. Moreover, such an approach does not address the performance problems that can result from up-sizing selected components, such as increased parasitic capacitance.

Accordingly, a need exists for an integrated circuit design technique for detecting fabrication process variations, thereby enabling process variance compensation schemes to be implemented.

SUMMARY OF THE INVENTION

The invention is an on-chip variance detection technique for detecting variances in integrated circuit components such as result from fabrication processing variations. Detecting these variances allows compensation schemes to be implemented, such as by making voltage and/or current adjustments in the operation of the integrated circuit, or selected portions of the integrated circuit.

In one aspect of the invention, the variance detection technique involves fabricating variance detection circuitry that includes at least one nominal detection component and at least one up-sized detection component such that the operational response of the detection circuitry is dependent upon the respective effects of variances on the nominal and up-sized detection components. The nominal detection component is fabricated with dimensions corresponding to the nominal dimensions for corresponding IC components. The up-sized detection is fabricated with at least one dimension that is sufficiently greater than the corresponding nominal dimension for corresponding IC components that the up-sized detection component is significantly less affected by IC component variances than the nominal detection component.

Variance detection is accomplished by detecting the operational response of the detection circuitry, and converting that response into a variance indication signal representative of the variance associated with the integrated circuit. This variance indication signal can then be used to compensate for variances associated with the integrated circuit.

In more specific aspects of the invention, variance detection circuitry can be implemented for either bipolar logic using resistors as the detection component, or MOS logic using MOSFET transistors as the detection component. Such detection circuitry can be incorporated into the integrated circuit, effecting compensation for fabrication processing variances.

For bipolar applications, the detection circuitry can include a nominal detection resistor with a nominal width, and an up-sized detection resistor with a resistor width that is substantially greater than nominal. For MOS applications, the detection circuitry can include a nominal detection MOS transistor with a nominal gate length, and an up-sized detection MOS transistor with a gate length that is substantially greater than nominal. In either case the voltage drop across the up-sized detection component relative to the nominal detection component can be applied to either a voltage source or a current source to obtain an appropriate variance indication signal.

Exemplary embodiments of the variance detection technique of the invention are used to provide process variance compensation for both bipolar and MOS applications. For a bipolar application, a variance compensated voltage regulator includes nominal and up-sized detection resistors such that the operational response of the circuit is a function of process variances, enabling it to provide a compensated voltage output (rather than a nominal regulated voltage output). For an MOS application, separate variance compensated MOS current sources are used to drive the HI-to-LO and LO-to-HI states of a TTL/MOS output cell, with each current source being controlled by variance detection circuit that includes nominal and up-sized MOSFETs.

An alternative scheme for detecting variations in both MOS processing and voltage supply is based on the use of a shunt MOSFET to supply a portion of the current demand for a bipolar current source. An output MOSFET has its gate and drain coupled to the collector of the bipolar current source, to which is also coupled the drain of the shunt MOSFET, such that the current supplied to the bipolar current source is provided by the output and shunt MOSFETs. The gate of the output MOSFET provides a variance compensated voltage output. Since the bipolar current source is assumed to be constant, MOS processing and voltage supply variations that cause a change in the current supplied by the shunt transistor must be counterbalanced by an opposite change in the current supplied by the output MOSFET, which is reflected in a change in its gate voltage, thereby providing a variance compensated voltage output.

The technical advantages of the invention include the following. The variance detection technique can be implemented on-chip, detecting variances in selected components of an integrated circuit. The technique enables the integrated circuit designer to implement on-chip compensations schemes for selected portions of the circuit, thereby reducing the effects of component variances on the circuit design. The technique is based on the decreased sensitivity to variances exhibited by IC components that are up-sized relative to components with nominal dimensions. In one alternative technique, process variances are detected based on relative changes in operational response caused by process variations for unlike IC components. In another alternative technique, variations in voltage supply as well as MOS processing can be detected using a shunt transistor in the current supply network of a current source.

BRIEF DESCRIPTION OF THE DRAWINGS

For a more complete understanding of the invention, and for further features and advantages, reference is now made to the following Detailed Description of an exemplary embodiment of the invention, taken Drawings, in which.

DETAILED DESCRIPTION OF THE INVENTION

The Detailed Description of exemplary embodiments of the on chip variance detection technique is organized as follows:

1. Process Variance Detection
1.1. Bipolar Processing Variances
1.2. MOS Processing Variances
2. Exemplary Variance Compensation Circuitry
2.1. Bipolar Compensation Circuitry
2.2. MOS Compensation Circuitry
3. Alternate Embodiments
3.1. Variance Detection Using Different Components
3.2. Temperature/Supply Voltage Compensation
4. Conclusion The exemplary variance detection technique focuses on detecting variances that result from variations in fabrication processing for integrated circuit (IC) components. The variance detection technique has general applicability to on-chip variance detection and associated compensation schemes, and the design choices involved in specific implementations are not critical to the invention.

1. Process Variance Detection.

The exemplary process variance detection technique can be used to determine the extent that fabrication processing variations affect selected components of an integrated circuit. It is based on the decreased sensitivity to processing variations exhibited by components, such as resistors or MOSFETs, that are up-sized relative to similar components with nominal dimensions for the particular integrated circuit design.

The process variance detection technique involves fabricating detection circuitry including detection components with both nominal and up-sized dimensions, and detecting the differences in operational response of the nominal and up-sized detection components. These operational differences may result from either strong or weak processing conditions that effect the IC components in the same way, and that affect the nominal components significantly more than they affect the up-sized components.

For bipolar components, the process variance detection technique is implemented by focusing on resistor dimensions, and in particular on resistor width. For MOS components, the process variance detection technique is implemented by focusing on MOSFET gate dimensions, and in particular on gate length.

1.1. Bipolar Processing Variances.

Figure 1:
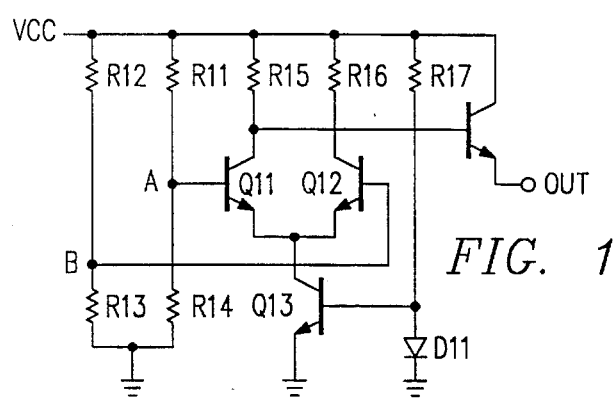
FIG. 1 is a schematic of an exemplary variance detection bipolar circuit.

FIG. 1 is a simplified schematic of an exemplary bipolar variance detection circuit for detecting fabrication processing variances in resistors.

The variance detection circuitry includes a resistor bridge and an amplifier. The resistor bridge includes resistors R11, R12, R13, and R14. The amplifier includes bipolar transistors Q11, Q12, and Q13, together with biasing resistors R15, R16 and R17, and a diode D11.

For the exemplary configuration, nominal detection resistor R11 is fabricated with a width that is nominal for. the integrated circuit design, such as 1.5 microns. R12, R13, and R14 are up-sized detection resistors fabricated with a relatively large resistor width, such as 6 microns. All resistor values are the same, such as 10K. Thus nominal detection resistor R11 will be relatively more sensitive to processing variations than the up-sized detection resistors R12, R13, and R14.

To illustrate the operation of this variance detection circuitry, assume that VCC is 5.0 volts nominal, and that weak fabrication processing results in resistor widths that are about 0.15 microns too narrow. The nominal resistor R11 will be about 10% too narrow, while the up-sized resistors will be about 2.5% too narrow.

With the resulting change in resistor values, and in particular the greater percentage variance in the nominal resistor R11, the voltage at A will be about 2.4 V, while the voltage at B will be about 2.5 V. This 0.1 V difference is amplified by transistors Q11, Q12, and Q13, so that the variance indication output voltage from bipolar transistor Q14 will be higher than nominal.

By choosing the proper ratio of R15, R16, and R17, the variance indication output voltage may be selected for under-compensation, over-compensation or precise compensation.

1.2. MOS Processing Variances.

Figure 2:
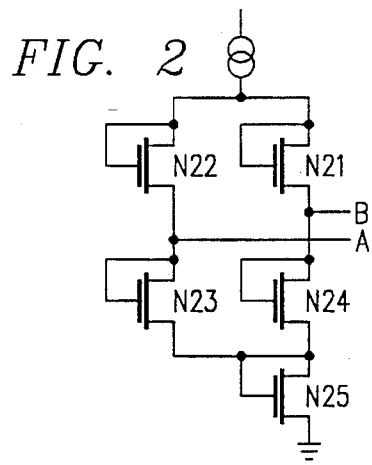
FIG. 2 is a schematic of an exemplary variance detection MOSFET circuit.

FIG. 2 is a schematic of an exemplary MOS variance detection circuit for detecting fabrication processing variances in MOSFET transistors.

The variance detection circuitry includes a MOSFET circuit formed by N-channel MOSFET transistors N21, N22, N23, and N24. For the exemplary configuration, nominal detection transistor N21 is fabricated with a gate length that is nominal for the integrated circuit design, such as 1 micron. N22, N23, and N24 are up-sized detection transistors fabricated with a relatively long gate length, such as 3 microns. Transistor N25 is used for level setting.

In operation, because nominal detection transistor N21 will be relatively more sensitive to processing variations than the up-sized detection transistors N22, N23, and N24. Thus, under weak processing conditions in which gate lengths are greater than nominal, the voltage drop across N21 will be larger than that across N22, resulting in a voltage offset between nodes A and B. This voltage offset provides a variance indication voltage that can be amplified if desired.

2. Exemplary Variance Compensation Circuitry.

Figure 3:
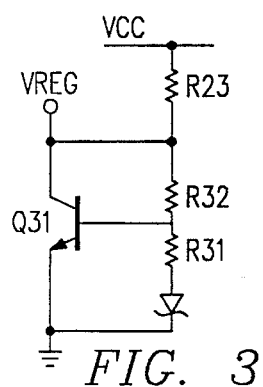
FIG. 3 is a schematic of an exemplary variance compensated voltage regulator with variance detection bipolar circuitry.
Figure 4:
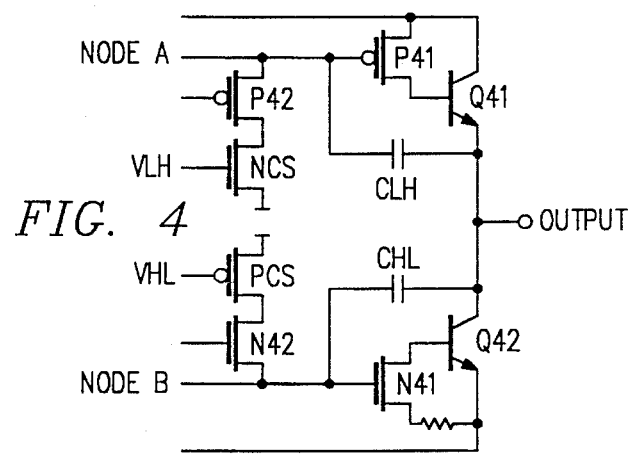
FIG. 4 is a schematic of an exemplary TTL/MOS output cell with variance compensated current source control.
Figure 5:
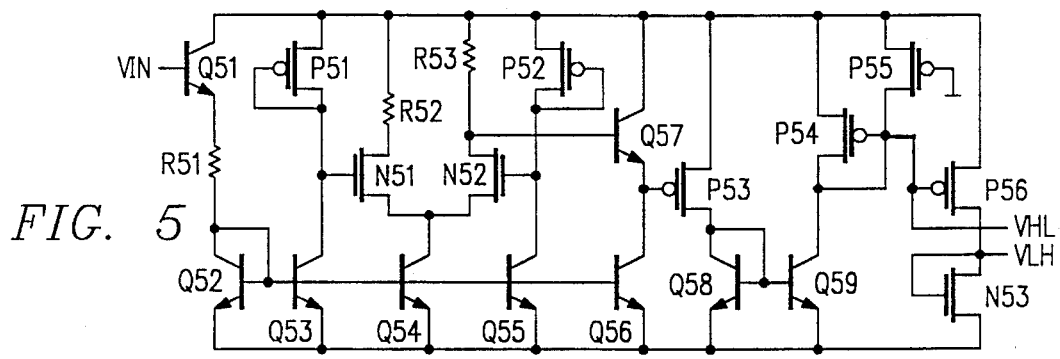
FIG. 5 is a schematic of an exemplary variance detection and compensation MOSFET circuit for providing variance compensation bias voltages to the output cell in FIG. 4.

Using the process variance detection technique of the invention enables the integrated circuit designer to compensate for these variances, and the variations in IC performance that they cause. FIGS. 3, 4, and 5 illustrate exemplary bipolar and MOS compensation circuitry that uses the process variance detection technique.

2.1. Bipolar Compensation Circuitry.

FIG. 3 is a simplified schematic of a voltage regulator for providing a voltage output VREG that can be used to compensate for fabrication processing variances in other bipolar circuits. The voltage regulator includes a bipolar transistor Q31 and a biasing network consisting of R31, R32, R33, and Schottky diode D31.

Under nominal fabrication processing conditions, R31, R32, and R33 are fabricated with the same nominal width, such as 3 microns. Assuming typical values of 4K for R31 and, to achieve a multiplier effect, 8K for R32, and assuming voltages of 0.4 V on D31 and 0.8 V on the base of Q31, then about 100 microamps flows through R31 and R32, and the regulated voltage output VREG is about 1.6 V.

Under strong processing conditions is which resistor widths widen by, for example, 10%, the values of both R31 and R32 increase by about 10% respectively to 4.4K and 8.8K. The current through R31, and therefore through R32, decreases to about 91 microamps. As a result, VREG is still about 1.6 volts.

However, the strong fabrication processing also affects the resistor values in the other circuits being supplied the voltage regulator. In accordance with the variance detection technique of the invention, the voltage regulator can be designed to detect processing variances, and provide a compensated voltage output from the voltage regulator that will effect corresponding compensation in other circuits.

Specifically, if R31 is made wide relative to R32, it will be relatively less sensitive to processing variances. That is, resistor R31 can be up-sized to be sufficiently wider than R32 that processing variances will cause only a 5% change in the up-sized resistor R31, versus the 10% change in the nominal resistor R32. Again, under strong processing conditions, the resulting value of the up-sized resistor R31 will be 4.2K (instead of 4.4K), while the value of the nominal resistor R32 will still be 8.8K.

In operation, due to process variance, the current in the up-sized resistor R31 falls to about 95 microamps. This same current through the nominal resistor R32, which has an effective value of 8.8K due to processing variance, yields an output voltage VREG of 1.64 volts. This increase in VREG supplied to other circuits effects a compensation for strong fabrication processing.

2.2. MOS Compensation Circuitry.

FIGS. 4 and 5 are schematics of respectively a TTL/MOS output cell and an associated bias generator. The bias generator includes process variance detection circuitry, and provides variance compensated bias voltages to control both the low-to-high (LH) and high-to-low (HL) switching of the output cell.

FIG. 4 is a simplified schematic of a TTL/MOS output cell that includes LH and HL bipolar transistors Q41 and Q42. The driving network for Q41 includes p-channel transistor P41 and feedback capacitor CLH, while the driving network for Q42 includes n-channel transistor N41 and feedback capacitor CHL.

P41, which drives Q41, is controlled by an n-channel current source NCS—the p-channel transistor P42 is included so that the current source NCS can be shut off when the output transistor Q41 is not switching. Similarly, N41, which drives Q42, is controlled by a p-channel current source PCS—the n-channel transistor N42 is included so that the current source PCS can be shut off when the output transistor Q42 is not switching. The gate of current source NCS is driven by a bias voltage VLH, while the gate of current source PCS is driven by a bias voltage VHL.

These bias voltages, which are provided by the variance compensated bias generator (FIG. 5), are a function of process variances—they cause the current sources to compensate for the effects of process variances on the performance of the output cell. That is, in the case of weak MOS processing (gate lengths greater than nominal), the output from the TTL/MOS output cell would normally slow down. To provide compensation, the bias generator increases VLH and decreases VHL, increasing current in the respective current sources.

FIG. 5 is a simplified schematic of the variance compensated bias generator which includes an input stage formed by bipolar transistor Q51, resistor R51, and bipolar transistor Q52. The bias generator is driven by a VIN bias voltage that is designed to create a constant current through Q51 and Q52 independent of supply voltage.

The constant current through Q52 is mirrored in bipolar transistors Q53, Q54, Q55, and Q56. The current through Q53 is provided by p-channel transistor P51 and the current through Q55 is provided by p-channel transistor P52, while the current through Q54 is provided by n-channel transistors N51 and N52.

Transistors P51 and P52 comprise process variance detection circuitry for detecting variations in MOS processing.

Specifically, the variance detection transistor P51 is fabricated with a nominal gate length, while up-sized detection transistor P52 is fabricated with a gate length that is relatively long in comparison.

Under nominal MOS processing conditions, the equal currents in Q53 and Q55 would cause equal voltage drops across transistors P51 and P52. However, because the up-sized transistor P52 is significantly less sensitive to process variations than the nominal transistor 51, process variations will cause the voltage drops across these transistors to be different.

For example, under weak MOS processing conditions, the voltage drop across nominal transistor P51 is greater than that across the up-sized transistor P52. As a result, the gate of N52 is at a higher potential than the gate of N51, causing extra current to flow through N2, lowering the potential at the base of an emitter follower transistor Q57.

Lowering the potential at the base of Q57 lowers the potential at the gate of p-channel current source P53. Thus, the current through P53 increases with weak processing in proportion to the degree of process variance detected by nominal and up-sized detection transistors P51 and P52, providing a process variance indication.

The variance indication provided by transistor P53 is used to compensate for the effects of process variances by controlling the bias voltages VLH and VHL output by the TTL/MOS bias generator.

The variance indication current through current source P53 also flows through bipolar transistor Q58, and that current is mirrored in bipolar transistor Q59. Most of the current in Q59 is provided by p-channel transistor P54, which generates the bias voltage VHL. Thus, the bias voltage VHL is dependent upon the variance indication current through the current source P53.

The function of p-channel shunt transistor P55 is described in Section 3.2. In general, this shunt transistor provides additional process variance compensation, as well as compensation for supply voltage variations.

The variance compensated bias line VHL is distributed to each TTL/MOS output cell (FIG. 4), and specifically to the gate of each p-channel current source transistor PCS. As a result, the variance compensated current through transistor P54 is mirrored in the current source transistor PCS, which is therefore variance compensated.

The variance compensated bias voltage VHL also feeds the gate of p-channel transistor P56, so that the current through this transistor is variance compensated. The variance compensated current through P56 also flows through n-channel transistor N53, which generates the bias voltage VLH.

The variance compensated bias line VLH is distributed to each TTL/MOS output cell (FIG. 4), and specifically to the gate of each n-channel current source transistor NCS. As a result, the variance compensated current through transistor N53 is mirrored in the current source transistor NCS, which is therefore variance compensated.

In summary, the bias generator includes variance detection circuitry comprising nominal and up-sized detection transistors P51 and P52 and current source transistor P53. The detection transistors P51 and P52 detect processing variances and correspondingly establish the variance indication current through current source P53. The variance indication current from transistor P53 determines the variance compensation current through transistor P54, which in turn, determines the variance compensated bias voltages VHL and VLH.

3. Alternative Embodiments.

The exemplary embodiments of the variance detection and compensation technique of the invention have been based on detecting the different effect of fabrication processing variances on like components with different dimensional configurations. For certain applications, alternative variance and compensation schemes for can be used, including compensating for process variances using unlike components, and compensating for temperature and supply voltage variances using a shunt transistor.

3.1. Variance Detection Using Unlike Components.

Figure 6A:
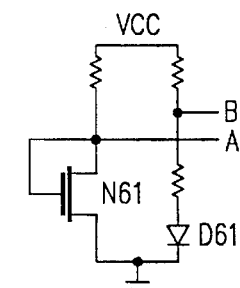
FIGS. 6a–6c are schematics of exemplary variance detection circuits using different components for detecting fabrication processing variances.
Figure 6B:
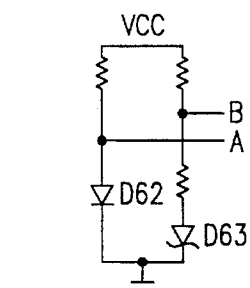
Figure 6C:
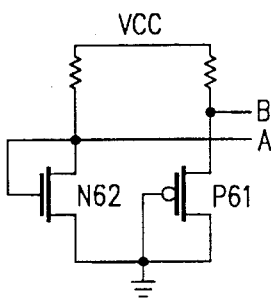

FIGS. 6a–6c schematically illustrate process variance detection circuitry that uses process variances associated with unlike components. For example, detection circuitry based on unlike components could focus on such parameters as the Vbe of a bipolar transistor and the Vf of a Schottky diode.

FIG. 6a illustrates a variance detection circuit that includes an n-channel transistor N61 and a diode D61. FIG. 6b illustrates a variance detection circuit that includes a diode D62 and a Schottky diode D63. FIG. 6c illustrates a detection circuit that includes an n-channel transistor N62 and a p-channel transistor P61.

In each case, fabrication processing variances cause an offset in the voltages A and B according to how these processing variances predictably affect the unlike detection components. This voltage offset can be used to provide a process variance indication.

3.2. Supply Voltage Compensation.

In addition to fabrication processing variances, integrated circuits are subject to variances that result from supply voltage changes. For example, for MOS processing, increasing supply voltage causes the output of the TTL/MOS output cell to speed up—compensating for this variance necessitates decreasing the current in the current sources NCS and PCS, and therefore, decreasing bias voltage VLH and increasing bias voltage VHL.

Referring to FIG. 5, the shunt transistor P55 is responsible for supply voltage compensation and part of the process compensation of the bias generator. Although the transistor P54 provides most of the current in the transistor Q59 (which mirrors the variance indication current in the current source P53), some of the Q59 current is supplied by the shunt transistor P55.

For supply voltage variances, as supply voltage increases, the current through shunt transistor P55 increases. Since the current through Q59 remains essentially constant, the current through transistor P54 must decrease, increasing VHL.

This increase in the bias line voltage VHL causes a compensating decrease in the current through current source PCS in the output cell.

For process variances, the shunt transistor P55 helps compensate for process variances in P54 and PCS. That is, without the shunt transistor P55, virtually all the current in Q59 would flow through transistor P54 and be mirrored in current source PCS, unaffected by process variances in those transistors. With shunt transistor P55 included, some of the current in Q59 is supplied by the shunt transistor. Under weak processing conditions, for example, the shunt transistor P55 supplies less current, so the current supplied by transistor P54 increases. This current increase causes a corresponding decrease in the bias voltage VHL, which increases the current through the current source PCS in the output cell.

4. Conclusion.

Although the Detailed Description of the invention has been directed to certain exemplary embodiments, various modifications of these exemplary embodiments, as well as alternative embodiments, will be suggested to those skilled in the art. It is to be understood that the invention encompass any modifications or alternative embodiments that fall within the scope of the appended Claims.

What is claimed is:

1. An on-chip variance detection method for detecting variances in integrated circuit (IC) components, such as result from fabrication process variations, comprising the steps:

fabricating at least one nominal MOSFET and at least one up-sized MOSFET;

said up-sized MOSFET being fabricated with a gate length that is sufficiently greater than a gate length of said nominal MOSFET such that said up-sized MOSFET is significantly less affected by fabrication process variations than said nominal MOSFET;

measuring an operational response of said nominal MOSFET relative to an operational response of said up-sized MOSFET, and converting that measurement into a variance indication signal representative of fabrication process variations.

2. An on-chip variance detection method for detecting variances in selected integrated circuit (IC) components, such as result from fabrication process variations, comprising the steps:

fabricating at least one nominal detection component and at least one up-sized detection component;

said up-sized detection component being fabricated with at least one dimension that is sufficiently greater than a corresponding dimension of said nominal detection component that said up-sized detection component is significantly less affected by IC component variances than said nominal detection component;

measuring an operational response of said up-sized detection component relative to an operational response of said nominal detection component, and converting that measurement into a variance indication signal representative of fabrication process variations; and in response to the variance indication signal, compensating for fabrication process variations.

3. An on-chip variance detection circuit for detecting variances in integrated circuit (IC) components, such as result from fabrication process variations, comprising:

at least one nominal MOSFET and at least one up-sized MOSFET;

said up-sized MOSFET having a gate length that is sufficiently greater than a gate length of said nominal MOSFET such that said up-sized MOSFET is significantly less affected by fabrication process variations than said nominal MOSFET;

detection circuit for detecting on operational response of said up-sized MOSFET relative to said nominal MOSFET, and generating a variance indication signal representative of fabrication process variations.

4. The variance detection circuit of claim 3 wherein said detection circuit further comprises a current source that provides said variance indication signal in response to the relative difference in gate-to-source voltages across said nominal and up-sized MOSFETs caused by component variances.

5. The variance detection circuit of claim 3 wherein said detection circuit comprises a transistor network that includes said nominal MOSFET and said up-sized MOSFET, configured such that gate length variances cause respective variations in the gate-to-source voltages for said nominal MOSFET and said up-sized MOSFET.

6. A circuit for detecting variations in MOSFET components comprising;

a nominal detection MOSFET with a nominal gate length;

an up-sized detection MOSFET with an up-sized gate length that is sufficiently greater than the nominal gate length such that said up-sized MOSFET is significantly less affected by fabrication process variations than said nominal MOSFET;

a first current source coupled to the nominal detection MOSFET;

a second current source coupled to the up-sized detection MOSFET; and a differential transistor pair coupled to the nominal detection MOSFET and the up-sized detection MOSFET for comparing the voltage across the nominal detection MOSFET with the voltage across the up-sized detection MOSFET.

7. The circuit of claim 6 further comprising a third current source coupled to the differential transistor pair.

8. The circuit of claim 7 wherein the third current source is a current mirror transistor.

9. The circuit of claim 6 further comprising a bias generator for controlling the first and second current sources.

10. The circuit of claim 6 wherein the first and second current sources are current mirror transistors.

11. The circuit of claim 6 further comprising variance compensation circuitry coupled to the differential transistor pair for providing a variance compensation signal that is dependent upon the respective effect of variances on said nominal and up-sized detection MOSFETs.

12. The circuit of claim 11 wherein the variance compensation circuitry comprises:

an emitter follower transistor coupled to the differential transistor pair; and a current source transistor controlled by the emitter follower transistor.

13. The circuit of claim 12 further comprising a fourth current source coupled to the emitter follower transistor.

14. The circuit of claim 13 wherein the fourth current source is a current mirror transistor.

* * * * *